United States Patent
Yan et al.

(10) Patent No.: US 12,322,671 B2
(45) Date of Patent: Jun. 3, 2025

(54) GUARD RING STRUCTURE, SEMICONDUCTOR STRUCTURE AND MANUFACTURING METHOD

(71) Applicant: CHANGXIN MEMORY TECHNOLOGIES, INC., Hefei (CN)

(72) Inventors: Hua Yan, Hefei (CN); Hsin-Pin Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/605,733

(22) PCT Filed: Jul. 8, 2021

(86) PCT No.: PCT/CN2021/105209
§ 371 (c)(1),
(2) Date: Oct. 22, 2021

(87) PCT Pub. No.: WO2022/188320
PCT Pub. Date: Sep. 15, 2022

(65) Prior Publication Data
US 2024/0055309 A1    Feb. 15, 2024

(30) Foreign Application Priority Data
Mar. 12, 2021   (CN) .......... 202110270706.X (51) Int. Cl.
*H01L 23/31* (2006.01)
*H01L 21/304* (2006.01)
*H01L 21/78* (2006.01)

(52) U.S. Cl.
CPC ........ *H01L 23/3107* (2013.01); *H01L 21/304* (2013.01); *H01L 21/78* (2013.01)

(58) Field of Classification Search
CPC ... H01L 23/3107; H01L 21/304; H01L 21/78; H01L 23/585; H01L 23/562
See application file for complete search history.

(56) References Cited

U.S. PATENT DOCUMENTS

| | | | | |
|---|---|---|---|---|
| 2008/0048228 A1* | 2/2008 | Sakoh | .............. | H10B 12/09 257/296 |
| 2012/0009789 A1* | 1/2012 | Usami | .............. | H01L 23/585 257/E21.585 |

(Continued)

FOREIGN PATENT DOCUMENTS

| CN | 1988155 A | 6/2007 |
|---|---|---|
| CN | 101373742 A | 2/2009 |
| CN | 104701271 A | 6/2015 |

(Continued)

OTHER PUBLICATIONS

PCT/CN2021/105209 International Search Report mailed Dec. 17, 2021.

*Primary Examiner* — Thanh T Nguyen
(74) *Attorney, Agent, or Firm* — Syncoda LLC; Feng Ma (57) ABSTRACT

A guard ring structure includes: a bottom metal layer; a protection structure located on the bottom metal layer, wherein the protection structure includes an insertion portion, an interconnection portion, and a metal layer stacked in sequence from bottom to top, and the insertion portion is inserted into the nearest underlining metal layer under the interconnection.

13 Claims, 10 Drawing Sheets

(56) References Cited

U.S. PATENT DOCUMENTS

2015/0348917 A1* 12/2015 Tsai ................. H01L 23/585
                                                              438/618
2018/0315707 A1    11/2018  Fox et al.

FOREIGN PATENT DOCUMENTS

| CN | 105870069 A | 8/2016 |
| CN | 105990313 B | 1/2019 |
| CN | 105977226 B | 7/2019 |
| CN | 111403345 A | 7/2020 |

* cited by examiner

GUARD RING STRUCTURE, SEMICONDUCTOR STRUCTURE AND MANUFACTURING METHOD

TECHNICAL FIELD

This application relates to the field of semiconductor manufacturing, in particular to a guard ring structure, a semiconductor structure and a manufacturing method thereof.

BACKGROUND

The sealing guard ring is usually formed between the scribe lane of each chip of the wafer and the chip. When the dicing knife cuts the wafer along the cutting path, the sealing guard ring can prevent the stress generated by the dicing knife from rupturing the active device area, and the sealing guard ring can prevent the penetration of water vapor and the diffusion of acid-containing substances, alkali-containing substances or pollution sources. Chemical damage.

As the size of the device continues to decrease, the requirements for the sealing guard ring in the wafer cutting process are getting higher and higher. The traditional sealing guard ring is gradually unable to meet the requirements, and it is easy to crack during the wafer cutting process, resulting in The stress damages the chip, or the sealing performance of the sealing guard ring is affected, and it cannot effectively block the penetration of external moisture or the diffusion of other chemical substances.

SUMMARY

A guard ring structure, a semiconductor structure and a manufacturing method thereof are provided according to some embodiments of the current disclosure.

A guard ring structure includes: a bottom metal layer; a protection structure located on the bottom metal layer, the protection structure includes an insertion portion, an interconnection portion, and a metal layer, stacked in sequence from bottom to top, and the insertion portion is inserted to a nearest metal layer under the interconnection.

A semiconductor structure includes: a substrate; a dielectric layer located on the substrate; the guard ring structure as described in f the above embodiments, herein the guard ring structure is located in the dielectric layer.

A method for preparing a semiconductor structure includes the following steps: providing a substrate; forming a dielectric layer on the substrate, and forming a guard ring structure in the dielectric layer as described in the above-mentioned embodiments.

The above-mentioned guard ring structure inserts the insertion portion into the nearest metal layer below the interconnection portion, instead of integrating the underlying metal layer and the protection structure used in the traditional technical solution, and ensures that the sealing effect of the guard ring structure is not affected. At the same time, it can also benefit from the plug-in connection between the insertion portion and the underlying metal layer when external stress acts on the guard ring structure, which buffers the external stress and reduces the possibility of cracking of the guard ring structure to a certain extent. Thus, the ability by the guard ring structure to resist external stress is improved.

BRIEF DESCRIPTION OF THE DRAWINGS

In order to more clearly describe the technical solutions in the embodiments of the present application or the traditional technology, the following will briefly introduce the drawings that need to be used in the description of the embodiments or the traditional technology. Obviously, the drawings in the following description are merely present For some of the embodiments of the application, for those of ordinary skill in the art, other drawings can be obtained based on these drawings without creative work.

DETAILED DESCRIPTION OF THE PREFERRED EMBODIMENTS

To facilitate the understanding of this application, a more comprehensive description of this application is presented with reference to related drawings. The preferred embodiments of the application are shown in the accompanying drawings. This application can be implemented in many different ways, thus is not limited to the embodiments described herein. On the contrary, providing these embodiments makes the understanding of the disclosure more thorough and comprehensive.

Unless otherwise defined, all technical and scientific terms used herein have the same meaning as commonly understood by those skilled in the technical field of this application. The terminology used in the specification of the application herein is only for the purpose of describing specific embodiments, and is not intended to limit the application. The term "and/or" as used herein includes any and all combinations of one or more related listed items.

When describing the positional relationship, unless otherwise specified, when an element such as a layer, film or substrate is referred to as being "on" another film layer, it can be directly on the other film layer or an intermediate film layer may also be present. Furthermore, when a layer is referred to as being "under" another layer, it can be directly below, or there may be one or more intermediate layers. It is also understood that when a layer is referred to as being "between" two layers, it can be the only layer between the two layers, or one or more intervening layers may also be present.

In the case of using the "including", "having", and "including" described in this article, unless clearly defined terms are used, such as "only", "consisting of", etc., another component may be added. Unless mentioned to the contrary, terms in the singular form may include the plural form, and it cannot be understood that the number is one.

A guard ring, that is, a sealing guard ring, is usually arranged for a semiconductor chip between the adjacent chips in the scribe lanes on the wafer. The scaling guard ring has at least the following two functions: one is to reduce the impact of the stress generated by the dicing knife on the chips to a certain extent and also reduce the risk of damage to the chip during the cutting process: the other is to block the penetration of water vapor or acid-containing substances from chemical damage to the chip caused by the diffusion of alkali-containing substances or other contamination sources.

Figure 1:
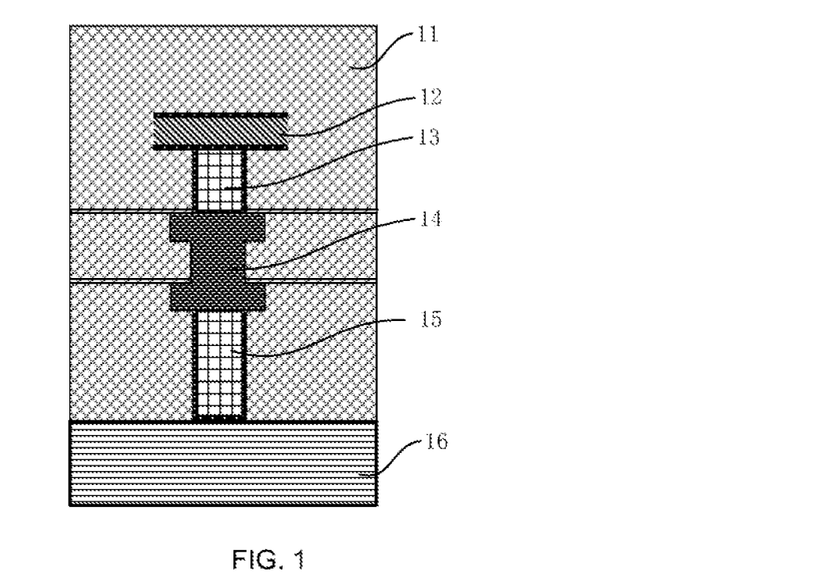
FIG. 1 is a schematic diagram of a cross-sectional view of a semiconductor structure with a traditional guard ring.
Figure 2:
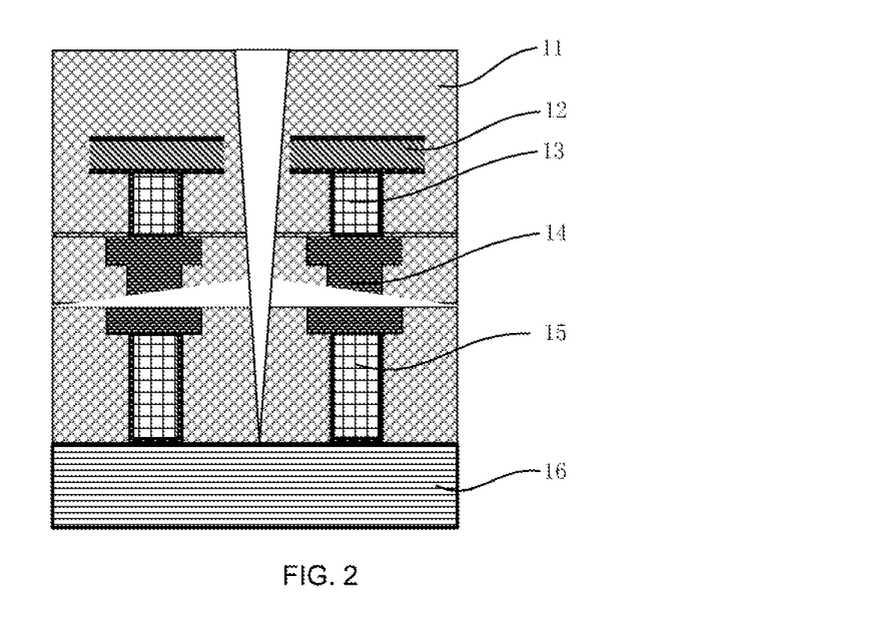
FIG. 2 is a schematic diagram of the conventional guard ring structure in the semiconductor structure when cracking occurs during the cutting process.

A traditional guard ring structure is shown in FIG. 1. Wherein, the sealing guard ring structure is fully arranged in the dielectric layer 11. From top to bottom, there are the top metal layer 12, the interconnecting plug 13, the spacer, the guard ring structure 14, the conductive plug 15 and the substrate 16. Among them, the guard ring structure 14 plays a role in resisting stress. When the wafer is diced, as shown in FIG. 2, the adjacent sealing guard rings are all affected by the stress generated by the dicing knife, and the traditional guard ring structure 14 is prone to cracks, so the sealing guard ring loses its protective effect.

Figure 3:
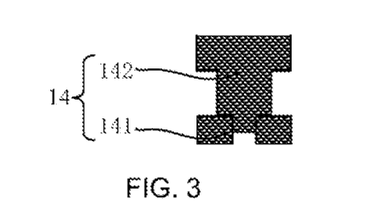
FIG. 3 is a schematic cross-sectional view of a guard ring structure according to an embodiment of the disclosure.

To improve the stress resistance of the guard ring and reduce the risk of chip damage during wafer dicing, the guard ring structure 14 is improved in this application. As shown in FIG. 3, an embodiment of the present application discloses a guard ring structure 14, including: a bottom metal layer 141; a protection structure 142, located on the bottom metal layer 141, the protection structure 142 includes, from bottom to top, the insertion portion, the interconnection portion and the metal layer, which are sequentially stacked, and the insertion portion is inserted into the metal layer below which is the closest to the interconnection portion. The "nearest metal layer under the interconnection" described in this embodiment may be the bottom metal layer 141. When a multi-layer protective structure is included in the guard ring, the "nearest metal layer under the interconnection" may also be a metal layer in a protective structure other than the top layer.

The above-mentioned guard ring structure 14 is a pin-type structure. By inserting the insertion portion into the bottom metal layer 141, a tight connection between the protective structure 142 and the bottom metal layer 141 can be achieved, thereby ensuring that the scaling guard ring can prevent water vapor and/or other chemical substances from penetrating to cause damage to the chip; at the same time, because the insertion portion and the bottom metal layer 141 are connected by a pin type (rather than the integrated connection shown in FIG. 1), it can provide better resistance to the sealing guard ring when subjected to external stress.

Figure 4:
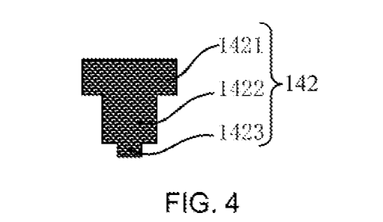
FIG. 4 is a schematic cross-sectional view of a protection structure according to an embodiment of the disclosure.

In an example, the insertion portion 1423, the interconnection portion 1422, and the metal layer 1421 in the protection structure 142 are shown in FIG. 4. The width of the interconnection portion 1422 is greater than the width of the insertion portion 1423 and smaller than the width of the metal layer 1421 in the protection structure; the width of the metal layer 1421 in the protection structure is the same as the width of the underlying metal layer 141. First, the width of the interconnection portion 1422 is greater than the width of the insertion portion 1423, so that when the insertion portion 1423 is inserted into the underlying metal layer 141, the interconnection portion 1422 and the underlying metal layer 141 form a mutually supporting structure. Secondly, setting the width of the interconnecting portion 1422 to be smaller than the width of the metal layer 1421 in the protection structure can save materials for preparing the protection structure, reduce costs, and improve the ability of the guard ring structure to resist external stress.

In one example, the underlying metal layer 141 and the insert portion 1423, the interconnection portion 1422, and the metal layer 1421 in the protection structure are all ring structures around the protected chip, so that the guard ring structure disclosed in the present application can be applied to a sealing guard ring on a wafer. The chip is enclosed in a sealing guard ring structure. In this way, the stress transmitted in any direction will be weakened or offset by the sealing guard ring, so as to protect the chip from being damaged by the stress.

In an example, please continue to refer to FIG. 3, a first gap is formed in the bottom metal layer 141. The first gap is used for accommodating the insertion portion. Further, the first gap is an annular gap, and the first gap penetrates the bottom metal layer 141 to divide the bottom metal layer 141 into a first bottom metal layer and a second bottom metal layer arranged at an interval; the first bottom metal layer, the second bottom metal layer The second bottom metal layer and the insertion portion, the interconnection portion and the metal layer in the protection structure are all in a ring structure.

Figure 5:
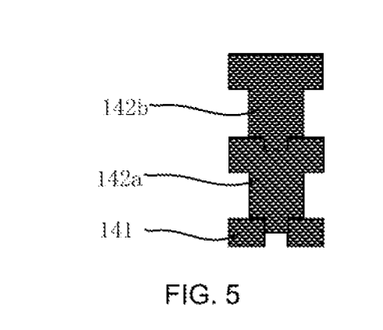
FIG. 5 is a schematic cross-sectional view of another guard ring structure with a double-layer protection structure according to an embodiment of the disclosure.

In an example, the number of the protection structures 142 is multiple, and the multiple protection structures are sequentially stacked one above the other; a second gap is formed in the metal layer of the protection structure which is not at the top. As an example, as shown in FIG. 5, the guard ring structure 14 includes two protection structures stacked one above the other: a first protection structure 142a and a second protection structure 142b. By designing multiple protection structures stacked on top of each other, the height of the guard ring structure can be flexibly adjusted according to the thickness of the chip. When multiple protection structures are stacked on top of each other, a second gap may be formed in the metal layer of the non-top protection structure to accommodate the insertion portion of the protection structure above the protection structure, thereby realizing the tight connection of the protection structures.

Figure 6:
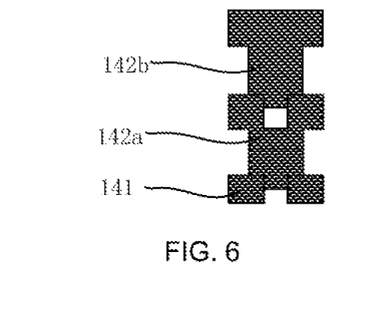
FIG. 6 is a schematic cross-sectional view of another guard ring structure with a double-layer protection structure according to an embodiment of the disclosure.

In one example, as shown in FIG. 6, the second gap penetrates the metal layer in the non-top protection structure 142 to divide the metal layer in the non-top protection structure 142 into two spaced metal layers, the first metal layer and the second metal layer. By increasing the depth of the second gap, the tearing toughness of the metal layer in the protective structure 142 can be fully utilized to resist the external stress.

The application also discloses a semiconductor structure, including: a substrate 16; a dielectric layer 11 located on the substrate 16; the guard ring structure 14 according to any one of the above embodiments, the guard ring structure 14 is located within the dielectric layer 11. The semiconductor structure disclosed herein will have enhanced ability to resist external stress while the sealing is ensured, provided by the guard ring structure 14 described in the above-mentioned embodiment.

Figure 7:
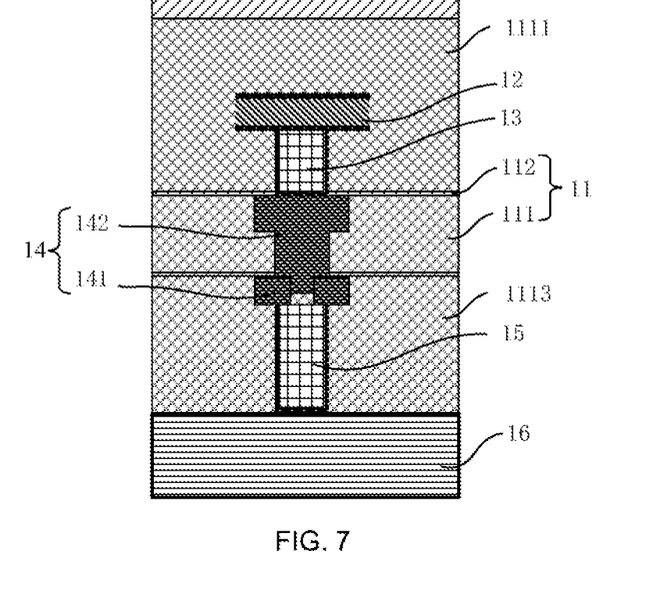
FIG. 7 is a schematic cross-sectional view of a semiconductor structure having the guard ring structure shown in FIG. 3 according to an embodiment of the disclosure.

In one example, as shown in FIG. 7, the semiconductor structure includes the guard ring structure 14 as shown in FIG. 3, the dielectric layer 11 including a first dielectric layer 111 and a second dielectric layer 112 alternately stacked from bottom to top. Herein, the first dielectric layer 111 may be a silicon dioxide layer, and the second dielectric layer 112 is an interlayer made of silicon nitride.

In an example, the semiconductor structure shown in FIG. 7 further includes: an interconnection plug 13 located on the protection structure 142 and electrically connected to the protection structure 142; a top metal layer 12 located on the upper surface of the interconnection plug 13. In addition, the semiconductor structure further includes a top dielectric layer 1111, and the interconnection plug 13 and the top metal layer 12 are arranged in the top dielectric layer 1111.

As an example, the interconnection plug 13 includes a U-shaped metal outer layer structure filled with metal tungsten inside. The material of the metal outer layer may be metallic titanium or titanium nitride material. The top metal layer 12 includes alternately stacked metal structures. As an example, the alternately stacked metal structures include: a metal titanium layer, a metal aluminum layer, and a metal titanium layer.

Continue to refer to FIG. 7 as an example. A bottom dielectric layer 1113 can be formed on the substrate 16, and a conductive plug 15 is formed in the bottom dielectric layer 1113; the nearest metal layer 141 at the bottom of the guard ring 142 is in contact with the conductive plug 15. Preparing the conductive plug 15 includes, first disposing the bottom dielectric layer 1113, and then etching the dielectric layer 1113 to make a space structure for accommodating the conductive plug 15, and finally depositing metal to form the conductive plug 15. As an example, the material of the bottom dielectric layer 1113 may be silicon dioxide. The material and structure of the conductive plug 15 can be the same as that of the interconnection plug 13, that is, the conductive plug 15 also includes a U-shaped metal outer layer filled with a metal tungsten inside, and the metal outer layer can be metal titanium or titanium nitride material.

Figure 8:
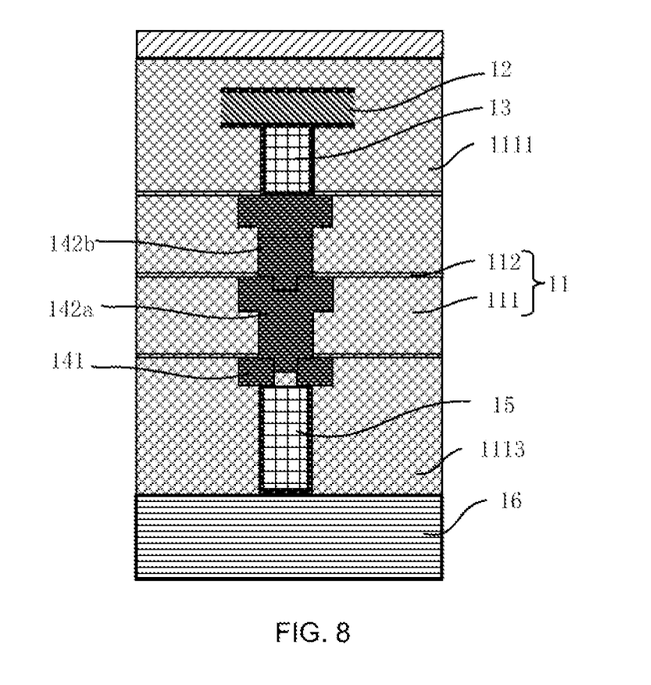
FIG. 8 is a schematic cross-sectional view of a semiconductor structure having the guard ring structure shown in FIG. 5 according to an embodiment of the disclosure.

In one example, as shown in FIG. 8, the semiconductor structure includes the guard ring structure 14 as shown in FIG. 5. The guard ring structure 14 includes two protection structures stacked one above the other: a first protection structure 142*a* and a second protection structure 142*b*.

The application also discloses a method for preparing a semiconductor structure, including the following steps: providing a substrate; forming a dielectric layer on the substrate, and forming the guard ring structure in the dielectric layer as described in any of the above-mentioned embodiments.

Figure 9:
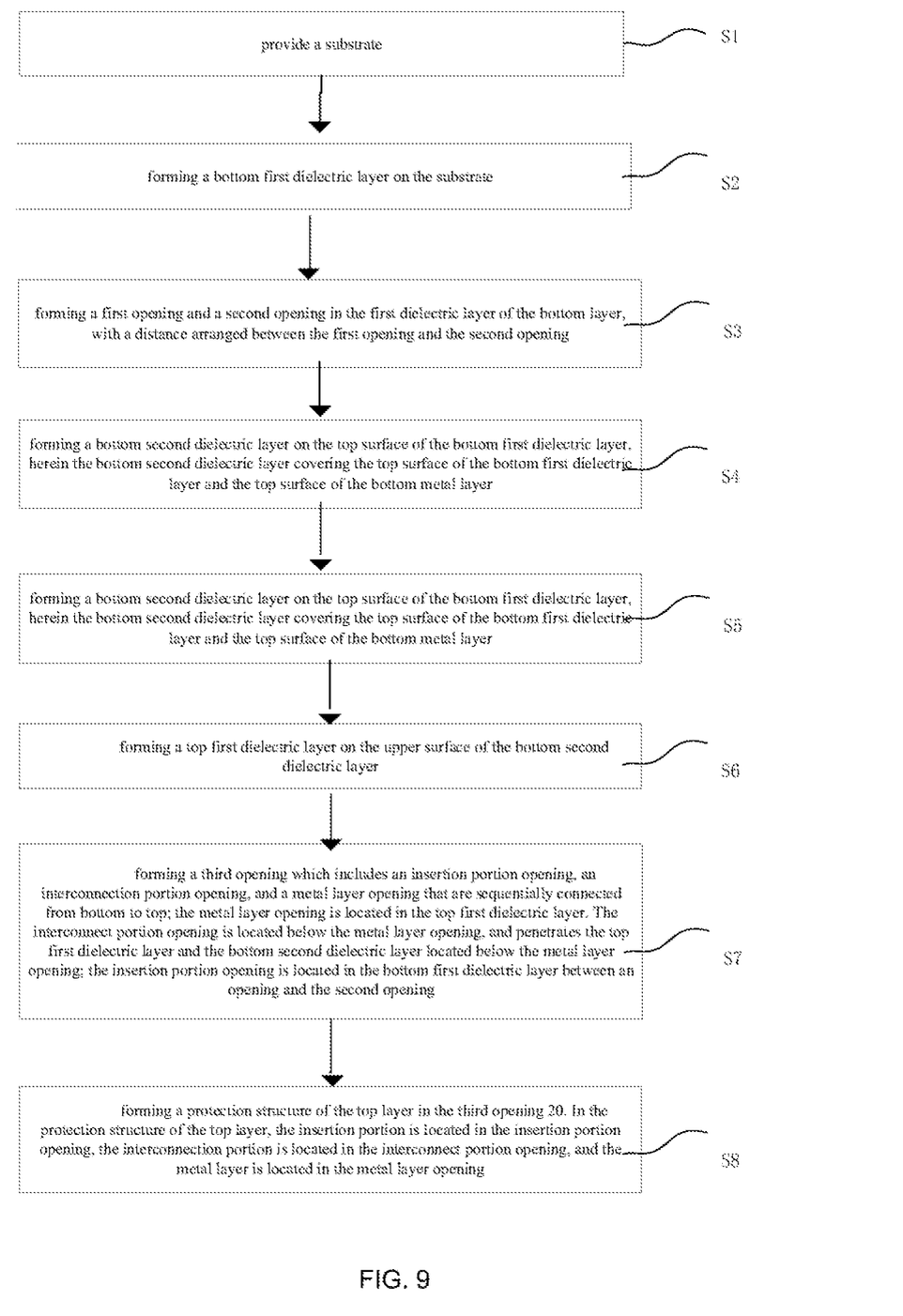
FIG. 9 is a flowchart of a manufacturing method of a semiconductor structure according to an embodiment of the disclosure.

In an example, as shown in FIG. 9, a method for preparing the semiconductor structure is provided. The method can be used to prepare the semiconductor structure shown in FIG. 7, the method includes the following steps:

S1: provide a substrate.

S2: forming a bottom first dielectric layer on the substrate.

Figure 11:
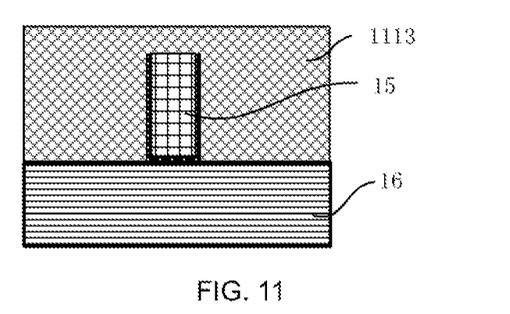
FIGS. 11 to 18 are schematic cross-sectional views of the structures obtained in each step of a method for manufacturing a semiconductor structure according to an embodiment of the disclosure.

In S2, the bottom first dielectric layer may be the bottom dielectric layer 1113 in FIG. 7. As an example, the material of the bottom first dielectric layer may be silicon dioxide. As shown in FIG. 11, a conductive plug 15 is prepared inside the first dielectric layer of the bottom layer. The thickness of the bottom first dielectric layer is greater than the height of the conductive plug 15. Therefore, there is a silicon dioxide layer with a certain thickness on the upper portion of the conductive plug 15.

S3: forming a first opening 18 and a second opening 19 in the first dielectric layer of the bottom layer, with a distance arranged between the first opening 18 and the second opening 19.

Figure 12:
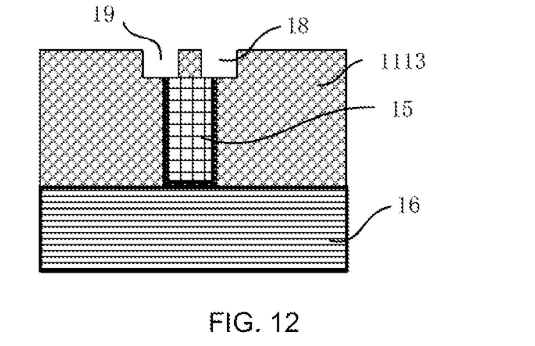

As shown in FIG. 12, a first opening 18 and a second opening 19 are formed in the silicon dioxide layer on the upper portion of the conductive plug 15. Both the first opening 18 and the second opening 19 are connected to the conductive plug 15. Herein, a certain width of dielectric layer material remains between the first opening 18 and the second opening 19, which can be etched in a subsequent process to obtain a gap, which facilitates the insertion of the insertion portion of the protection structure 142.

Figure 13:
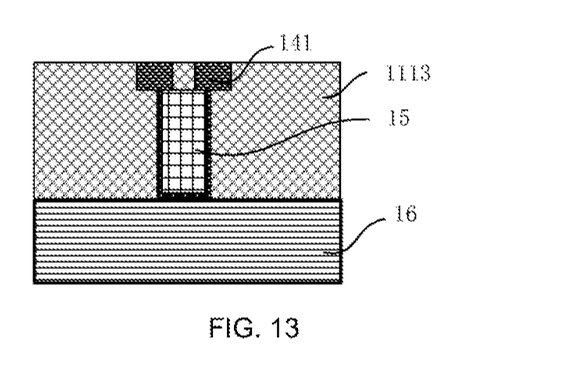

S4: filling a metal material layer in the first opening 18 and the second opening 19, and the metal material layer filled in the first opening 18 and the second opening 19 together constitute the bottom metal layer 141 and is shown in FIG. 13.

As an example, the filled metal material may be copper. The process of filling copper includes electroplating. Copper is electroplated in the first opening and the second opening. Since the copper surface obtained by electroplating growth is not smooth enough, after the electroplating process, it is necessary to use chemical mechanical polishing (CMP) to polish the copper surface to acquire a sufficiently smooth surface of the bottom metal layer. The purpose of this is that when the protective structure with the insertion portion is butted with the underlying metal layer, both surfaces are smooth enough to provide excellent sealing. As shown in FIG. 13, the bottom metal layer includes two parts separated from each other, and the two parts have the same size and are symmetrical with each other.

S5: forming a bottom second dielectric layer 1121 on the top surface of the bottom first dielectric layer, herein the bottom second dielectric layer 1121 covering the top surface of the bottom first dielectric layer and the top surface of the bottom metal layer.

Figure 14:
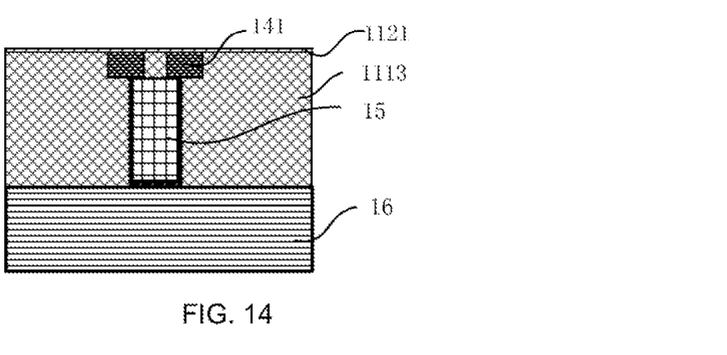

As shown in FIG. 14, the thickness of the bottom second dielectric layer 1121 is smaller than the thickness of the bottom metal layer 141. The bottom second dielectric layer 1121 covers the upper surface of the bottom first dielectric layer and the top surface of the bottom metal layer 141 to form a smooth plane. The bottom second dielectric layer 1121 may be an interlayer made of silicon nitride.

S6: forming a top first dielectric layer 1112 on the upper surface of the bottom second dielectric layer 1121.

The material of the top first dielectric layer 1112 can be the same as that of the bottom first dielectric layer, and both can be silicon dioxide.

S7: forming a third opening 20. The third opening 20 includes an insertion portion opening, an interconnection portion opening, and a metal layer opening that are sequentially disposed from bottom to top; the metal layer opening is located in the top first dielectric layer 1112. The interconnect portion opening is located below the metal layer opening, and penetrates the top first dielectric layer 1112 and the bottom second dielectric layer 1121 located below the metal layer opening; the insertion portion opening is located in the bottom first dielectric layer between an opening 18 and the second opening 19.

Figure 15:
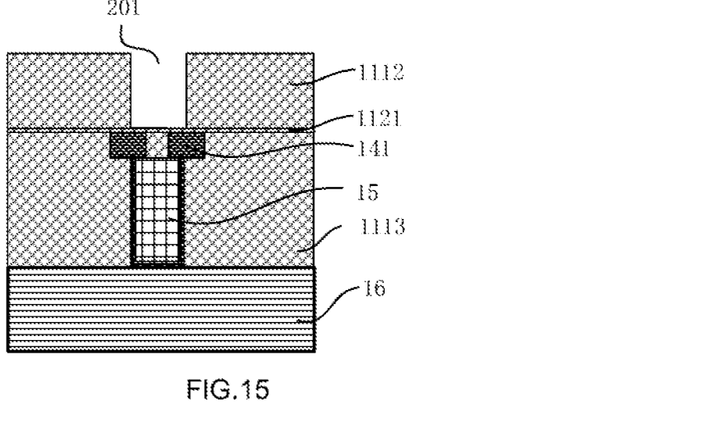
Figure 16:
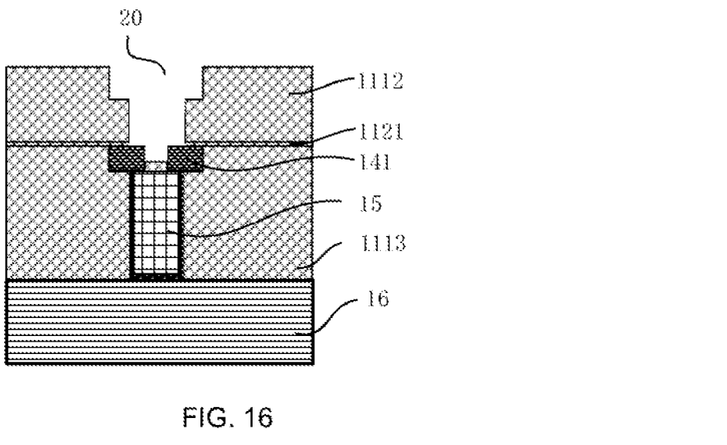
Figure 17:
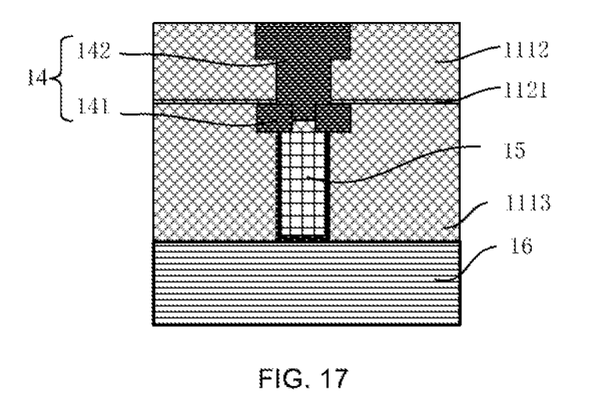

As an example shown in FIGS. 15-17, the process of forming the third opening 20 includes the following steps:

S71: forming a third opening pattern 201 in the top first dielectric layer 1112.

Specifically, the third opening pattern 201 can be formed in the top first dielectric layer by processes such as photolithography and etching. As shown in FIG. 15, the third opening pattern 201 penetrates the top first dielectric layer 1112 and exposes a part of the bottom second dielectric layer 1121.

S72: coating a bottom anti-reflective coating (BARC) on the bottom of the third opening pattern 201, and forming a third opening 20 on the basis of the third opening pattern 201.

The main components of the bottom anti-reflection layer are cross-linkable resin, thermal acid generator, surfactant and solvent, which can be used to absorb reflected light to reduce reflection. By coating the anti-reflection layer on the bottom of the third opening pattern 201, the shape of the pattern formed by the photolithography and etching processes can be controlled. As shown in FIG. 16, after coating the bottom anti-reflective layer, a second pattern is formed after further photolithography and etching processes. The third opening 20 includes an insertion portion opening, an interconnecting portion opening, and a metal layer opening.

S8: forming a protection structure of the top layer in the third opening 20. In the protection structure of the top layer, the insertion portion 1423 is located in the insertion portion opening, the interconnection portion 1422 is located in the interconnect portion opening, and the metal layer 1421 is located in the metal layer opening.

The protective structure of the top layer refers to the protective structure of the uppermost layer in the guard ring structure. When there is only one layer of protection structure, the protection structure of the top layer may be the protection structure 142 shown in FIG. 3. When there are two layers of protection structure, the protection structure of the top layer may be the second protection structure 142b shown in FIG. 5. As shown in FIG. 17, similar to the process of forming the bottom metal layer 141, copper is electroplated in the third opening, and the surface of the copper is polished by a chemical mechanical polishing process after the electroplating process to obtain a smooth metal surface.

Figure 18:
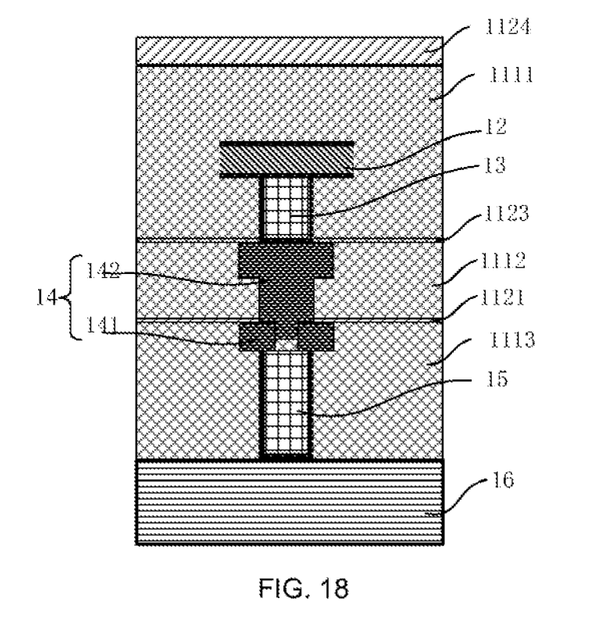

Finally, as shown in FIG. 18, an interconnection plug 13 and a top metal layer 12 are firmed above the guard ring structure 14. Specifically, the top second dielectric layer 1123 is formed first, and then the top dielectric layer 1111 is deposited on the top second dielectric layer 1123, and the interconnection plug 13 and the top metal layer 12 are formed in the top dielectric layer 1111. A second covering dielectric layer 1124 is formed on the top dielectric layer 1111.

Figure 10:
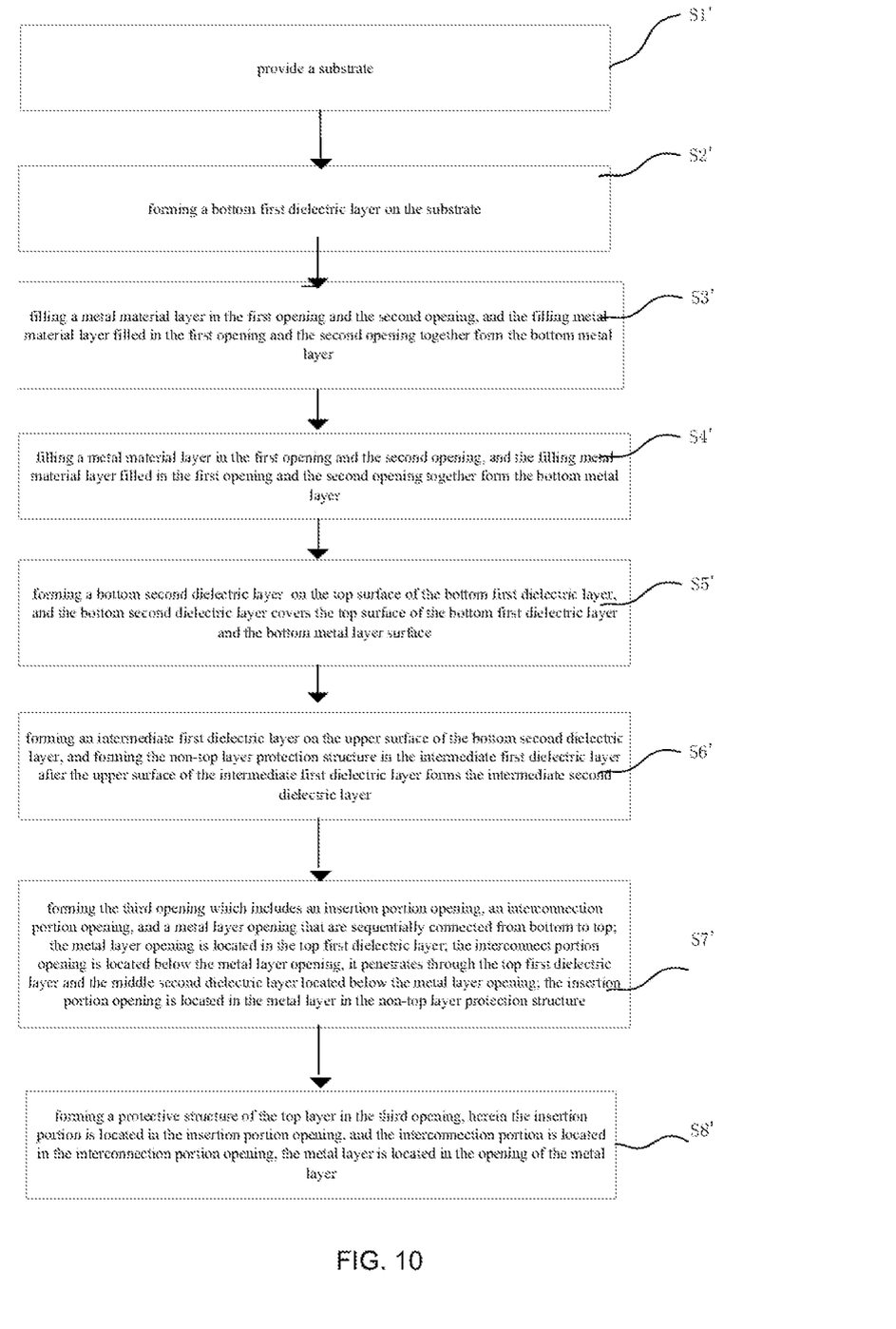
FIG. 10 is a flowchart of another method for manufacturing a semiconductor structure according to an embodiment of the disclosure.

In another example, as shown in FIG. 10, this application also discloses another method for preparing the semiconductor structure, which can be used to prepare the semiconductor structure shown in FIG. 8, including:

S1': provide a substrate.

S2': forming a bottom first dielectric layer on the substrate 16.

The bottom first dielectric layer may be the bottom dielectric layer 1113 in FIG. 7. As an example, the material of the bottom first dielectric layer may be silicon dioxide. As shown in FIG. 11, a conductive plug 15 is prepared inside the first dielectric layer of the bottom layer. The thickness of the bottom first dielectric layer is greater than the height of the conductive plug 15. Therefore, there is a silicon dioxide layer with a certain thickness on the upper portion of the conductive plug 15.

S3': forming a first opening 18 and a second opening 19 in the first dielectric layer of the bottom layer, and there is a distance between the first opening 18 and the second opening 19, and the distance constitutes the first gap.

S4': filling a metal material layer in the first opening 18 and the second opening 19, and the filling metal material layer filled in the first opening 18 and the second opening 19 together form the bottom metal layer 141.

S5': forming a bottom second dielectric layer 1121 on the top surface of the bottom first dielectric layer, and the bottom second dielectric layer 1121 covers the top surface of the bottom first dielectric layer and the bottom metal layer 141 surface.

The above steps have been described in more detail in the previous embodiment, and will not be repeated here.

S6': forming an intermediate first dielectric layer 1112' on the upper surface of the bottom second dielectric layer 1121, and forming the non-top layer protection structure in the intermediate first dielectric layer 1112' after the upper surface of the intermediate first dielectric layer 1112' forms the intermediate second dielectric layer 1122.

Figure 19:
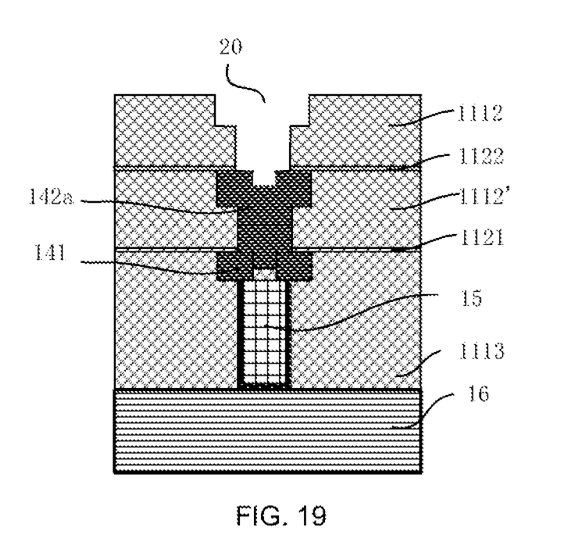
FIGS. 19 to 21 are schematic cross-sectional views of the structures obtained in some steps in a method for preparing a semiconductor structure with a guard ring of a double-layer protection structure according to an embodiment of the disclosure.

As shown in FIG. 19, the non-top layer protective structure refers to the protective structure located outside the uppermost layer when the protective structure has multiple layers. In this embodiment, the non-top protection structure may be the first protection structure 142a shown in FIG. 8. The intermediate first dielectric layer 1112' may be a silicon dioxide layer, and the intermediate second dielectric layer 1122 may be a silicon nitride layer.

S7': forming the third opening 20 which includes an insertion portion opening, an interconnection portion opening, and a metal layer opening that are sequentially connected from bottom to top: the metal layer opening is located in the top first dielectric layer 1112; the interconnect portion opening is located below the metal layer opening, it penetrates through the top first dielectric layer 1112 and the middle second dielectric layer 1122 located below the metal layer opening; the insertion portion opening is located in the metal layer in the non-top layer protection structure.

As an example, when a layer of protection structure has been formed, the third opening 20 formed after step ST is shown as the opening above the semiconductor structure in FIG. 19.

Figure 20:
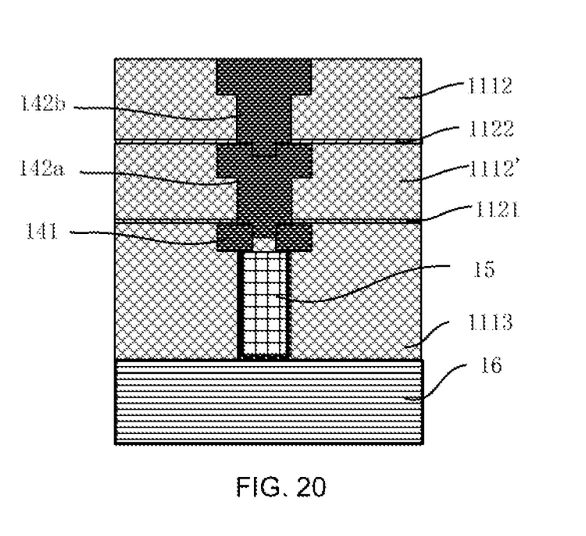

S8': forming a protective structure of the top layer in the third opening 20. In the protective structure of the top layer, the insertion portion 1423 is located in the insertion portion opening, and the interconnection portion 1422 is located in the interconnection portion opening, the metal layer 1421 is located in the opening of the metal layer, as shown in FIG. 20.

The protective structure of the top layer refers to the protective structure of the uppermost layer in the guard ring structure. When there are two layers of protection structure, the protection structure of the top layer may be the protection structure 142b shown in FIG. 5. In an example, after forming the protection structure of the top layer, the following steps are further included:

S9: a top second dielectric layer 1123 is formed on the upper surface of the top first dielectric layer 1112, and the top second dielectric layer 1123 covers the upper surface of the top first dielectric layer 1112 and the protective structure of the top layer upper surface.

S10: forming a first covering dielectric layer on the upper surface of the top second dielectric layer 1123, and forming an interconnection plug 13 and a top metal layer 12 stacked one above the other in the first covering dielectric layer; the connecting plug 13 is located on the protection structure of the top layer and is electrically connected to the protection structure of the top layer; the top metal layer 12 is located on the upper surface of the interconnecting plug 13.

As an example, the first covering dielectric layer may be the top dielectric layer 1111 described in FIG. 7.

S11: forming a second covering medium layer 1124 on the upper surface of the first covering medium layer.

Figure 21:
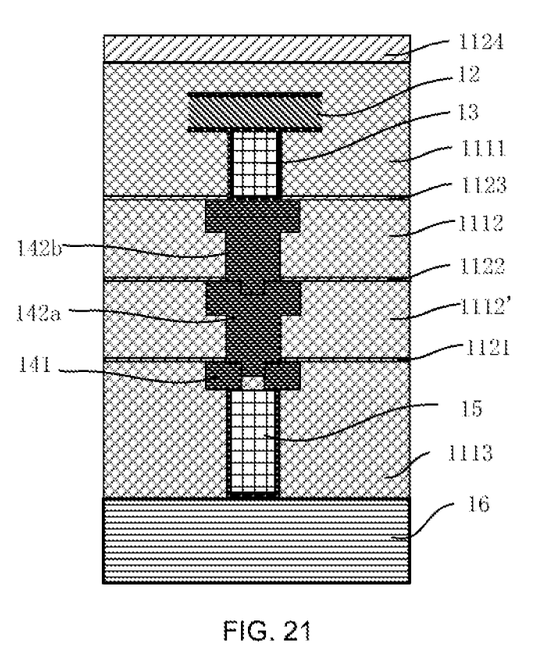

As an example, the material of the top first dielectric layer 1112 and the first covering dielectric layer may be silicon dioxide, and the material of the top second dielectric layer 1123 and the second cover dielectric layer 1124 may be silicon nitride. The resulting semiconductor structure is shown in FIG. 21.

Optionally, the height or the number of layers of the guard ring structure 14 can be adjusted according to the thickness of the sealing guard ring. By designing a plurality of protection structures stacked on top of each other, the height of the guard ring structure 14 can be flexibly adjusted according to the thickness of the wafer, and thus semiconductor structures of different heights can be prepared. The semiconductor structure prepared by the above method can meet the scribe line cutting requirements of wafers of different thicknesses, and while ensuring sealing properties, can provide wafers of different thicknesses with the ability to better resist external stress.

The technical features of the above-mentioned embodiments can be combined arbitrarily. To make the description concise, many possible combinations of the various technical features in the above-mentioned embodiments are not repeated or described here. However, as long as there is no contradiction in the combination of these technical features, they should be considered as within the scope of this specification.

The above-mentioned embodiments only express several implementation manners of the present application, and the description is relatively specific and detailed, but it should not be understood as a limitation to the scope of the patent application. It should be pointed out that for those of ordinary skill in the art, without departing from the concept of this application, several modifications and improvements can be made, and these all fall within the protection scope of this application. Therefore, the scope of protection of the patent in this application shall be subject to the appended claims.

The invention claimed is:

1. A guard ring structure, comprising:
a bottom metal layer; and
a protection structure located on the bottom metal layer, wherein the protection structure comprises, sequentially stacked from bottom to top, an insertion portion, an interconnection portion, and a metal layer, wherein the insertion portion is inserted into an underlying metal layer below the interconnection portion;
wherein a first gap is formed in the bottom metal layer, wherein the first gap penetrates the bottom metal layer to divide the bottom metal layer into a first bottom metal layers and a second bottom metal layer spaced apart; and
wherein the first gap is an annular gap, and wherein the first bottom metal layer, the second bottom metal layer, the insertion portion, the interconnection portion, and the metal layer in the protection structure are all ring structures around a protected chip.

2. The guard ring structure according to claim 1, wherein a width of the interconnection portion is greater than a width of the insertion portion and is smaller than a width of the metal layer in the protection structure; and wherein the width of the metal layer is a same as a width of the bottom metal layer.

3. The guard ring structure according to claim 1, wherein the underlying metal layer and the insertion portion, the interconnection portion, and the metal layer in the protection structure are all ring structures.

4. The guard ring structure according to claim 1, wherein a number of the protective structures is multiple, and the multiple of the protective structures are sequentially stacked one above the other; and wherein a non-top layer of the protective structure comprises a second gap formed in the metal layer.

5. The guard ring structure according to claim 4, wherein the second gap penetrates the metal layer in the protection structure other than a top layer to divide said metal layer into the first metal layer and the second metal layer spaced apart.

6. A semiconductor structure, including:
a substrate;
a dielectric layer disposed on the substrate; and
the guard ring structure according to claim 1, wherein the guard ring structure is located in the dielectric layer.

7. The semiconductor structure according to claim 6, wherein
the dielectric layer comprises a first dielectric layer and a second dielectric layer alternately stacked from bottom to top.

8. The semiconductor structure of claim 6, further comprising:
an interconnection plug disposed on the protection structure and electrically connected to the protection structure; and
a top metal layer disposed on an upper surface of the interconnection plug.

9. The semiconductor structure according to claim 7, wherein
a bottom dielectric layer is further formed on the substrate, wherein a conductive plug is formed in the bottom dielectric layer; and wherein a bottom metal layer is in contact with the conductive plug.

10. A method for manufacturing a semiconductor structure, comprising:
providing a substrate;
forming a dielectric layer on the substrate; and
forming the guard ring structure according to claim 1 in the dielectric layer.

11. The method according to claim 10, wherein
forming the dielectric layer on the substrate and forming the guard ring structure in the dielectric layer comprises:
forming a bottom first dielectric layer on the substrate;
forming a first opening and a second opening in the bottom first dielectric layer, wherein the first opening and a second opening are spaced apart;
filling the first opening and the second opening with a metal material layer, wherein the metal material layer constitutes the bottom metal layer;
forming a bottom second dielectric layer on a top surface of the bottom first dielectric layer, wherein the bottom second dielectric layer covers the top surface of the bottom first dielectric layer and a top surface of the bottom metal layer;
forming a top first dielectric layer on a top surface of the bottom second dielectric layer;
forming a third opening, wherein the third opening comprises, sequentially connected from bottom to top, an insertion portion opening, an interconnect portion opening, and a metal layer opening; wherein the metal layer opening is located in the top first dielectric layer; wherein the interconnect portion opening is located below the metal layer opening, and penetrates the top first dielectric layer and the bottom second dielectric layer below the metal layer opening;

wherein the insertion portion opening is located in the bottom first dielectric layer between the first opening and the second opening; and forming the protection structure of a top layer in the third opening, wherein the insertion portion is located in the insertion portion opening, wherein the interconnection portion is located in the interconnect portion opening, and wherein the metal layer is located in the metal layer opening.

12. The method according to claim 10, wherein forming the dielectric layer on the substrate and forming the guard ring structure in the dielectric layer comprise:

forming a bottom first dielectric layer on the substrate;

forming a first opening and a second opening spaced apart in the bottom first dielectric layer, wherein a distance between the first opening and the second opening constitutes the first gap;

filling a metal material layer in the first opening and the second opening, wherein said metal material layer constitutes the bottom metal layer;

forming a bottom second dielectric layer on a top surface of the bottom first dielectric layer, wherein the bottom second dielectric layer covers the top surface of the bottom first dielectric layer and the top surface of the bottom metal layer;

forming an intermediate first dielectric layer on a top surface of the bottom second dielectric layer, wherein a non-top layer protective structure is formed in the intermediate first dielectric layer, and wherein a second dielectric layer of the intermediate layer is formed on a surface on the intermediate first dielectric layer; and forming a third opening, wherein the third opening comprises, sequentially connected from bottom to top, an insertion portion opening, an interconnect portion opening, and a metal layer opening that;

wherein the metal layer opening is disposed in a top first dielectric layer; wherein the interconnect portion opening is disposed under the metal layer opening, and penetrates the top first dielectric layer and the middle layer second dielectric layer which is disposed below the metal layer opening; wherein the insertion portion opening is disposed in the protective structure of the non-top layer; and wherein the protective structure of the top layer is formed in the third opening, and in the protective structure of the top layer, the insertion portion is located in the insertion portion opening, and the interconnection portion is located in the interconnection portion opening, and the metal layer is located in the metal layer opening.

13. The method according to claim 11, wherein after forming the protection structure of the top layer, the method further comprises:

forming a top second dielectric layer on the top surface of the top first dielectric layer, wherein the top second dielectric layer covers the top surface of the top first dielectric layer and a top surface of the protection structure of the top layer;

forming a first covering dielectric layer on the top surface of the second dielectric layer of the top layer, and forming interconnecting plugs and a top metal layer stacked one above the other in the first covering dielectric layer; wherein the interconnection plugs are located on a top layer of the protection structure and electrically connected to the protection structure of the top layer; wherein the top metal layer is disposed on top surfaces of the interconnection plugs; and forming a second covering medium layer on a top surface of a first covering medium layer.

* * * * *